United States Patent [19]

Burggraaf et al.

[11] Patent Number: 5,160,618
[45] Date of Patent: Nov. 3, 1992

[54] METHOD FOR MANUFACTURING ULTRATHIN INORGANIC MEMBRANES

[75] Inventors: Antonij J. Burggraaf, Enschede, Netherlands; Yue-Sheng Lin, Cincinnati, Ohio

[73] Assignee: Air Products and Chemicals, Inc., Allentown, Pa.

[21] Appl. No.: 816,206

[22] Filed: Jan. 2, 1992

[51] Int. Cl.⁵ .............................................. B01D 53/22
[52] U.S. Cl. ................................ 210/490; 210/500.25
[58] Field of Search ............... 210/490, 500.25; 55/16, 55/158; 427/245, 246, 203

[56] References Cited

U.S. PATENT DOCUMENTS 5,106,654  4/1992  Isenberg ..................... 427/203 X

OTHER PUBLICATIONS

Pal et al.; Westinghouse R&D Center, Pittsburgh, Pa. (High Temperature Science 27(1990)251).
Burggraaf, et al.; (J. European Cer. Soc., 8(1991)59).

*Primary Examiner*—Frank Spear

[57] ABSTRACT

The present invention is a method for manufacturing ultrathin inorganic membranes comprising yttria-stabilized zirconia (YSZ) in a thickness of $\leq 0.5$ μm which has been deposited onto a lanthanum-doped alumina surface layer of a porous alumina substrate having an average pore diameter of less than about 50 nm. The inorganic membranes formed by the method provide oxygen flux rates superior to those known in the art and are suitable for numerous uses including processes for separating oxygen from oxygen-containing gaseous mixtures and in processes for partially oxidizing hydrocarbons to their corresponding oxidized products.

24 Claims, No Drawings

METHOD FOR MANUFACTURING ULTRATHIN INORGANIC MEMBRANES

TECHNICAL FIELD OF THE INVENTION

The present invention is a method for manufacturing ultrathin inorganic membranes which are useful in numerous applications such as in processes for separating oxygen from oxygen-containing gaseous mixtures and in processes for oxidizing hydrocarbons to their corresponding oxidized products. A suitable inorganic membrane comprises a yttria-stabilized zirconia layer having a thickness of about $\leq 0.5$ μm which has been deposited onto a porous lanthanum-doped alumina surface layer of a porous alumina substrate.

BACKGROUND OF THE INVENTION

Oxygen is required in increasingly greater quantities in industrial combustion and oxidation processes. Industrial processes for separating air into oxygen and its related constituents are typically based upon cryogenic distillation, adsorptive separation, chemical absorption and differential permeation through membrane media. Many analysts believe that the high equipment and operating costs of these processes have stifled the use of oxygen-based technologies in certain fields. Therefore, considerable effort is being undertaken to find more economical methods for producing oxygen. One of the most promising new technologies involves inorganic membranes formed from multicomponent metallic oxides such as titania-doped yttria-stabilized zirconia (YSZ) and praseodymia-modified zirconia.

Processes for separating air which utilize inorganic membranes formed from multicomponent metallic oxides are typically operated at high tempratures (e.g. 800° C. or more) wherein the membranes conduct both oxygen ions and electrons. When a difference in oxygen partial pressure exists on opposite sides of the inorganic membrane and operating conditions are properly controlled, pure oxygen is produced as oxygen ions migrate to the low pressure side of the membrane while an electron flux occurs in the opposite direction in order to conserve charge.

Inorganic membranes formed by depositing thin films of stabilized zirconia onto porous substrates have been prepared by numerous methods including chemical vapor deposition (CVD) and electrochemical vapor deposition (EVD). CVD processes utilize a plurality of gaseous precursors which react by an activated process to form one or more solid products which are deposited onto the surface of a substrate. Typical CVD processes comprise (1) transporting gas phase reactants to the substrate and (2) reacting the precursors to form a crystal growth of the solid on the substrate.

EVD is a specialized chemical vapor deposition technique which employs ionic conductivity as well as electronic conductivity of the mixed conducting oxide to deposit the desired layer of oxide onto the surface of the substrate. The process involves contacting a mixture of metal halides on one side of a porous substrate and an oxygen source on the other wherein the reactants interdiffuse into the pores of the porous substrate and react to form a multicomponent metallic oxide which is deposited on the pore walls. Continued deposition causes pore narrowing until eventually the pores become plugged with the multicomponent metallic oxide. Continued growth of the deposit can then occur due to conduction of oxygen from the oxygen source through the deposited plug of multicomponent oxide.

Pal and coworkers at Westinghouse R & D Center, Pittsburgh, PA (High Temperature Science 27 (1990) 251) have disclosed an EVD process wherein a multicomponent metallic oxide is deposited in the pores of a porous substrate by contacting various metal halides corresponding to the metals in the multicomponent oxide and a mixture of hydrogen and water on opposite sides of a substrate. The reactants diffuse into the substrate pores and react to form the multicomponent metal oxide which is deposited onto the walls of the pores. Following closure of the pores, film growth may continue on the surface of the porous substrate by EVD.

A. J. Burggraaf and coworkers (J. European Cer. Soc., 8 (1991) 59) have disclosed a method for depositing yttria-stabilized zirconia films onto porous substrates having relatively large pores ranging in diameter from 0.2 μm to 0.4 μm. An initial CVD deposition is believed to cause pore narrowing although not confirmed by measurements of gas permeation as a function of pressure drop. In a subsequent EVD stage, a film of yttria-stabilized zirconia having a thickness of 1.5 to 8 μm was deposited on the surface of the substrate by reacting $YCl_3$ and $ZrCl_4$ with oxygen which is electrochemically conducted by the deposited layer at temperatures above 1000° C. X-ray diffraction experiments indicated that the material had a cubic structure, orientated in the [100] direction with a minor monoclinic or tetragonal phase.

While the above-mentioned methods are capable of producing thin gas-tight stabilized zirconia films on porous substrates, a need in the art exists for an improved process for depositing an ultrathin dense layer of less than about 0.5 μm of a multicomponent metallic oxide onto a porous support in order to achieve enhanced oxygen flux of the membrane. Desirably, processing temperatures would be reduced compared to prior art processes in order to promote formation of low stress coatings, to reduce chemical reactions between the dense multicomponent oxide layer and the porous substrate and to minimize changes in the substrate microstructure typically caused by heating the material at unduly high temperatures.

BRIEF SUMMARY OF THE INVENTION

The present invention is a method for manufacturing ultrathin inorganic membranes which demonstrate utility in numerous applications including processes for separating oxygen from oxygen-containing gaseous mixtures, catalytic membrane reactors for partially oxidizing hydrocarbons to their corresponding oxidized products and in solid oxide fuel cells and oxygen sensors.

The inorganic membranes according to this invention comprise a layer of multicomponent oxide having a thickness of about $\leq 0.5$ μm which has been deposited onto a porous substrate. The multicomponent oxide layer is formed by reacting a mixture of metal halides with an oxidizing agent within the micropores of the surface layer of a porous substrate having an average pore diameter of less than about 50 nm. Further growth may then continue by EVD.

The multicomponent oxides which are deposited into the micropores of the surface layer of the porous substrate and onto the surface of the porous substrate are formed by reacting at least two metal halides represented by the fluorides, chlorides, bromides and iodides of metals selected from Groups 2, 3, 4 and 15 and the F block lanthanides of the Periodic Table of the Elements as adopted by IUPAC. A preferred multicomponent oxide is yttria-stabilized zirconia which is prepared by reacting $YCl_3$ and $ZrCl_4$ with an oxidizing agent comprising a mixture of oxygen and water.

The porous substrates onto which the multicomponent oxides are deposited are selected from porous substrates which comprise a porous surface layer having an average pore diameter of less than about 50 nm. Suitable porous substrates include alumina, silica, magnesia, titania, high temperature oxygen compatible metal alloys, metal oxide stabilized zirconia and compounds and mixtures thereof. The average pore diameter of the porous substrate surface layer is an essential feature of this invention.

A preferred membrane comprises yttria-stabilized zirconia which has been deposited into the micropores of a lanthanum-doped alumina surface layer of a porous alumina substrate having an average pore diameter less than about 50 nm and on the surface layer of the alumina substrate wherein the thickness of the yttria-stabilized zirconia is about $\leq 0.5$ μm. The yttria-stabilized zirconia layer is deposited at a temperature of about 700° to 1100° C., at a pressure ranging from 1 torr to 760 torr over a time period ranging from 1 minute to 2 hours.

The method for manufacturing the subject inorganic membranes comprises (a) independently heating at least two metal halides capable of forming the desired multicomponent oxide to temperatures sufficient to vaporize each of the metal halides; (b) introducing the vaporized metal halides into a first chamber of a reactor comprising two chambers which are connected by a removable porous substrate having a network of pores capable of transporting gases between the two chambers, the removable porous substrate further comprising a porous surface layer having an average pore diameter of less than about 50 nm; (c) introducing an oxidizing agent into a second chamber of the reactor; (d) contacting the metal halides and the oxidizing agent in the pores of the porous surface layer at a temperature, a pressure and for a time sufficient to deposit plugs of the multicomponent oxide within the pores of the surface layer of the substrate and to restrict growth of the plugs to a thickness of $\leq 0.5$ μm to form the inorganic membrane.

Applicants' method is capable of depositing a multicomponent metal oxide in the micropores of the surface layer of a porous substrate and onto the surface of the porous substrate wherein the thickness of the deposited multicomponent oxide is about $\leq 0.5$ μm. The defined thickness refers to the total dimension of the multicomponent oxide deposited into the micropores and the multicomponent oxide deposited on the surface layer of the porous substrate.

The inorganic membranes made by the present method demonstrate oxygen permeation fluxes in the order of $10^{-8}$ mol/cm$^2$s which are unexpectedly higher than membranes formed by methods known in the art. Moreover, deposition temperatures have been reduced compared to prior art processes which promotes formation of low stress coatings, reduces chemical reactions between the dense multicomponent oxide layer and the porous substrate and minimizes changes in the substrate microstructure caused by heating the material at unduly high temperatures.

DETAILED DESCRIPTION OF THE INVENTION

The present invention is a method for manufacturing ultrathin inorganic membranes which demonstrate utility in numerous applications including processes for separating oxygen from oxygen-containing gaseous mixtures, catalytic membrane reactors for partially oxidizing hydrocarbons to their corresponding oxidized products and in solid oxide fuel cells and oxygen sensors.

Applicants' method is capable of depositing a multicomponent metal oxide in the micropores of the surface layer of a porous substrate and onto the surface of the porous substrate wherein the total thickness of the deposited multicomponent oxide is about $\leq 0.5$ μm. The membranes made by the present method demonstrate oxygen permeation fluxes in the order of $10^{-8}$ mol/cm$^2$s which are unexpectedly higher than membranes comprising the same compositions formed by methods known in the art.

The multicomponent oxides which are deposited into the micropores of the surface layer of the porous substrate and onto the surface of the porous substrate are formed by reacting at least two metal halides represented by the iodides, fluorides, bromides and chlorides of metals selected from Groups 2, 3, 4 and 15 and the F block lanthanides of the Periodic Table of the Elements as defined by the IUPAC with an oxidizing agent under the specified reaction conditions. A more preferred multicomponent oxide contains zirconia in addition to one or more additional metals and oxides of metals.

The term "metal halide" refers to a compound having halide functionality and a metallic component which corresponds to one of the metals to be introduced into the multicomponent oxide. A preferred multicomponent oxide is yttria-stabilized zirconia which may be prepared by reacting $YCl_3$ and $ZrCl_4$ with an oxidizing agent such as a mixture of oxygen and water. Preferably, the material comprises from 3 mol % to about 12 mol % $Y_2O_3$ and possesses a cubic phase or a mixture of cubic and tetragonal phases. The amount of $Y_2O_3$ present in the material should be controlled in order to prevent thermally induced monoclinic/tetragonal phase transformation of zirconia at elevated temperatures.

The porous substrates onto which the multicomponent oxides are deposited are selected from porous substrates which comprise a porous surface layer having an average pore diameter of less than about 50 nm. Suitable porous substrates include alumina, silica, magnesia, titania, high temperature oxygen compatible metal alloys, metal oxide stabilized zirconia and compounds and physical mixtures thereof. Therefore, suitable substrates may be formed from a physical mixture of one or more of the enumerated materials as well as compounds formed from one or more of such materials. The average pore diameter of the porous substrate surface layer is an essential feature of this invention. Therefore, the preparative method must be tailored according to procedures well known in the art to control the average pore diameter.

A preferred membrane comprises a yttria-stabilized zirconia layer having a thickness of about $\leq 0.5$ μm which has been deposited into the micropores of a metal-doped alumina surface layer of a porous alumina substrate and on the surface of the alumina substrate. Suitable metals for doping the substrates of this invention include the F block lanthanides of the Periodic Table of the Elements. The doping of the surface layer of the porous substrate raises the temperature for the gamma to alpha $Al_2O_3$ phase transformation and stabilizes pore diameters at $\leq 1000°$ C.

The term "multicomponent metallic oxide" refers to an oxide of at least two different metals or a mixture of at least two different metal oxides, formed by reacting a mixture of metal halides with an oxidizing agent under suitable reaction conditions, which demonstrates electron conductivity as well as oxide ion conductivity at elevated temperatures. The porous substrates of this invention possess a network of pores through the entire depth of the substrate such that oxygen molecules can permeate through the substrate. Therefore, the term, porous substrate, does not refer to materials which merely possess surface or closed porosity.

Any combination of porous substrate and multicomponent metallic oxide can be utilized so long as their coefficients of thermal expansion are compatible and adverse chemical reactions do not occur between the porous substrate and multicomponent oxide at operating temperatures of the inorganic membrane. The porous substrates disclosed herein act as a compatible mechanical support for the dense multicomponent oxide layer.

The method for manufacturing the subject inorganic membranes comprises (a) independently heating at least two metal halides capable of forming the desired multicomponent metallic oxide to temperatures sufficient to vaporize each of the metal halides; (b) introducing the vaporized metal halides into a first chamber of a reactor comprising two chambers which are connected by a removable porous substrate having a network of pores capable of transporting gases between the two chambers, the removable porous substrate further comprising a porous surface layer having an average pore diameter of less than about 50 nm; (c) introducing an oxidizing agent into a second chamber of the reactor; (d) contacting the metal halides and the oxidizing agent in the pores of the porous surface layer at a temperature, a pressure and for a time sufficient to deposit plugs of the multticomponent oxide within the pores of the surface layer of the substrate and to restrict growth of the plugs to a thickness of about $\leq 0.5$ μm to form the inorganic membrane.

The initial step in Applicants' process for manufacturing the inorganic membranes comprises independently heating at least two metal halides to temperatures sufficient to vaporize each of the metal halides. The metal halides are precursors which will later be converted to the corresponding multicomponent metallic oxide when reacted in the presence of an oxidizing agent under reaction conditions sufficient to effect the conversion. In order to independently vaporize the metal halides selected as sources of the individual metal oxides making up the multicomponent metallic oxide to be formed, a plurality of sublimation beds are independently placed in a corresponding number of chambers under reduced pressure. The number of sublimation beds to be used is based on the number of metal halides necessary to form the desired multicomponent metallic oxide.

The sublimation beds containing the metal halides are independently heated to a temperature sufficient to create the desired vapor pressure of the metal halide to be introduced into the reactor. Any conventional heating means can be utilized such as resistance heating and induction heating. In the method according to the present invention, a conventional CVD/EVD reactor is utilized wherein the reactor has two chambers for receiving reactants. The reactor is constructed such that the porous substrate to be coated with the ultrathin multicomponent metallic oxide separates the two chambers.

The vaporized metal halides are introduced into a first chamber of the reactor and an oxidizing agent is introduced into the second chamber of the reactor. The two chambers of the reactor are connected by the network of pores within the porous substrate which is capable of transporting gases between the two chambers. An inert gas can be utilized to assist in transferring the metal halides into the first chamber of the reactor. Representative inert gases includes those which will not react with the metal halides used to form the multicomponent oxide or the porous substrate under the enumerated process conditions. Such inert gases include argon, nitrogen and helium.

A predetermined amount of each metal halide can be transferred into the reactor chamber by heating each metal halide under controlled conditions based upon the vapor pressure of each respective metal halide produced as a function of temperature and carrier gas flowrate. Suitable vaporizing temperatures are easily determined by those of ordinary skill in the art and will vary depending upon the desired vapor pressure of the metal halide, the desired growth rate and desired film thickness of the multicomponent oxide to be deposited onto the porous substrate.

The amount of oxidizing agent to be supplied into the reactor will vary depending upon the particular metal halides used, the vapor pressure of the metal halides, the ease of oxidation of the metal halides and the like. Suitable oxidizing agents include, but are not limited to, air, oxygen, ozone, $N_2O$, water and mixtures thereof. The preferred oxidizing agents are a mixture of oxygen and water or a mixture of hydrogen and water.

In the next step of the method, a mixture of the metal halides and the oxidizing agent are contacted in the pores of the porous surface layer of a porous substrate at a temperature, a pressure and for a time sufficient to deposit plugs of the multicomponent oxide within the micropores of the surface layer of the substrate and to restrict growth of the plugs to a thickness of about $\leq 0.5$ μm to form the inorganic membrane.

In the initial stages of the reaction, the multicomponent oxide is deposited into the pores of the surface layer of the porous substrate by a CVD mechanism until the pores are substantially narrowed in diameter or closed. The deposition temperature is controlled following pore closure in order to minimize further growth of the multicomponent oxide by the EVD mechanism which involves ionic conduction of oxygen through the multicomponent oxide plugs. Suitable general reaction conditions for controlling the depth of the multicomponent oxide include a temperature ranging from 600° to 1300° C., a pressure ranging from 1 to 760 torr and a time ranging from 1 minute to 10 hours. Reaction conditions for depositing yttria-stabilized zirconia on a metal-doped alumina surface of an alumina substrate include temperatures ranging from 700° to 1100° C., a pressure ranging from 1 to 760 torr and a reaction time ranging from 1 minute to 2 hours.

Applicants have discovered that very thin plugs of yttria-stabilized zirconia (0.3 to 0.5 μm) can be formed in the micropores of the porous layer of a porous substrate while minimizing continued growth of the yttria-stabilized zirconia by EVD. The rate of pore closure at 800° C. was found to depend on the vapor pressures of the respective halide precursors, to be inversely dependent on pore radius and to depend strongly on the presence of water vapor as the oxidant. Pore narrowing was confirmed by helium permeability measurements which showed a reduction in the ratio of viscous to Knudsen flow through the membranes after 20 minutes of deposition at 800° C. in the 10 nm pore diameter substrates.

Following formation of a plug of multicomponent oxide, continued film growth occurs via EVD based upon the mixed conductivity of the multicomponent oxide until the desired amount of multicomponent oxide deposition occurs. Oxygen or water is reduced at the oxygen/film interface and oxygen ions migrate through the growing film to the metal chloride/film interface, counterbalanced by electron migration in the film. The oxygen ions react at the metal chloride/film interface to form again the metal oxide. Since the ionic and electronic conductivities of the mixed conducting oxides are dependent on temperature, the amount of continued film growth by EVD can be controlled by adjusting the deposition temperature. Therefore, further film growth is minimized by operating at temperatures of about 800° C.

The following examples are provided to further illustrate the method for manufacturing the inorganic membranes of the present invention. The examples are illustrative and are not intended to limit the scope of the appended claims.

EXPERIMENTAL SECTION

Any conventional CVD/EVD reactor can be adapted to practice the present method. A suitable reactor design is presented in J. Europ. Ceramic Society 8 (1991) 59, the text which is incorporated by reference herein. The reactor used to make the inorganic membranes of the present invention consists of three sections: the reactor, the vacuum control section and the reactant delivery section.

The reactor consists of three dense alumina tubes. The largest tube is two meters long and has an inside diameter of 75 mm. The two other tubes are mounted concentrically inside the largest tube, one on each side. The porous substrate is cemented into the end of the smallest tube thereby separating the reactor space into two chambers, referred to as the metal halide chamber having a volume of 8030 ml, and the water chamber (or oxidizing agent chamber) having a volume of 375 ml.

The sublimation bed for each respective metal halide is placed in the larger inner alumina tube. Two types of sublimation beds may be used, the first being constructed of graphite in a configuration such that an inert gas stream may be passed over the metal halide powder in the bed. The second type is made of quartz in a configuration such that an inert gas carrier stream may be passed through a packed bed of the metal halide powder mixed with graphite granules.

The tube containing the sublimation beds is supported by a graphite ring which simultaneously acts as an oxygen scavenger in the metal halide chamber and as an isothermal zone for the substrate. The reactor is placed in a six-zone tubular furnace with each zone being controlled by a temperature controller to provide the desired temperature profile in the reactor. A vacuum pump and automatic throttle valves are used to regulate the pressures in the metal halide chamber and oxidizing agent chamber. Two pressure sensors are also used to monitor the pressures in each of the chambers.

A set of three mass flow controllers is used to regulate the inert carrier gas flowrates to the metal halide chamber, the oxidizing agent chamber and the metal halide sublimation beds, respectively. The hydrogen/water or air/water mixture is generated by bubbling hydrogen or air through a heated sparger filled with twice-distilled water. The water sparger is placed in a thermostatically controlled bath to ensure constant temperature. The air mass flow rate and total pressure of the water-saturated mixture in the sparger are controlled by a mass flow controller and a pressure controller, respectively.

The water-containing gas mixture can be directed either to the back of the substrate in the water chamber or directly to the pump by switching a three-way valve. An extra line for flushing the water chamber in the reactor with an inert gas such as argon may be provided. All components of the system were chosen and the system constructed so that the deposition method could be automatically controlled by a microporccessor or by manual control.

General Procedures:

Zirconium and yttrium chlorides are very hygroscopic. Therefore, the metal chlorides should be handled in a glove box flushed with nitrogen in order to prevent hydrates and/or oxychlorides from forming. The glove box is attached to the metal halide side of the reactor allowing for direct transfer of the metal chloride sublimation bed into the reactor. The quartz sublimation beds are filled with a mixture of the metal halide and graphite granules. The graphite acts as an oxygen scavenger for the residual oxygen still present in the gas atmosphere in the glove box and metal halide chamber.

EXAMPLE 1

Preparation of a Alpha-Alumina Porous Substrate

Disk-shaped porous ceramic substrates were prepared by uni-axially pressing alpha-alumina powder (Phillips Maatschappij B. V. Einhoven, The Netherlands) followed by sintering in a furnace at about 1150° C. These alpha-alumina substrates (disk size 39 mm×2 mm) had a porosity of 50 volume % and an average pore diameter of 0.16 $\mu$m. The disks were polished with sand paper followed by cleaning in an ultrasonic acetone bath. Thereafter, the disks were fired again at 1150° C. for more than 30 hours to ensure a good thermal stability of the substrate pore structure.

EXAMPLE 2

PREPARATION OF A LANTHANUM-IMPREGNATED ALUMINA SUBSTRATE

A Boehmite sol (1M boehmite) was prepared by adding aluminum secondary butoxide (Janssen Chimica, Belgium) to water and peptizing the solution with nitric acid ($HNO_3$ (mol)/alkoxide(mol)=0.07) according to the procedure described by A. F. M. Leenaars and coworkers (J. Mater. Sci., 19 (1984) 1077). A solution of polyvinyl alcohol (PVA) (molar mass 72000) (Fluka Chemika, Switzerland) was prepared by adding 3.5 g of PVA to 100 ml of a 0.05M $HNO_3$ solution.

The PVA solution was mixed with the boehmite sol (volume ratio 2:3) to form the PVA-boehmite sol. The alpha-alumina porous substrates prepared in Example 1 were dip-coated with the PVA-boehmite sol by contacting one side of the alpha-alumina porous disc for a short time (3-5 seconds) with the PVA-boehmite sol to form a supported gel. The substrate supported gel was dried at 40° C. in air followed by an extended period of calcination at 450° C. The calcined substrate was immersed in 10 ml of a 0.3M lanthanum nitrate solution followed by drying in air at room temperature and further calcination at 450° C., in order to prepare a lanthanum-impregnated alumina substrate.

EXAMPLE 3
PREPARATION OF A LANTHANUM-IMPREGNATED ALUMINA SUBSTRATE

A Boehmite sol (1M boehmite) was prepared according to Example 2. A small amount of lanthanum nitrate solution (0.3M, pH=1) was mixed with the boehmite sol to form a lanthanum-impregnated boehmite sol (molar ratio of $La(NO_3)_3$ to gamma-alumina was 0.033). The PVA solution prepared in Example 2 was mixed with the lanthanum-impregnated boehmite sol (volume ratio 2:3) to form the lanthanum-impregnated PVA-boehmite sol. The alpha-alumina porous substrate prepared in Example 1 was dip-coated with the lanthanum-impregnated PVA-boehmite sol by contacting one side of the alpha-alumina porous disc for a short time (3-5 seconds) with the lanthanum-impregnated PVA-boehmite sol to form a supported gel. The substrate supported gel was dried at 40° C. in air followed by an extended period of careful calcination at 450° C. in order to prepare a lanthanum-impregnated alumina substrate.

By comparison with unsupported lanthanum-impregnated PVA-boehmite sol derived substrates prepared by drying 40 ml of the sol in a 10 cm diameter petri-dish at room temperature, after a 30 hour calcination at 450° C., the average pore diameter was 3 nm as determined by nitrogen desorption isotherms. Following 30 hour calcinations at 1000° C. and 1100° C., the average pore diameters were 9 nm and 17 nm, respectively. The thickness of the supported top layer was estimated to be 5 $\mu$m from scanning electron micrographs.

EXAMPLE 4
PREPARATION OF AN ULTRATHIN INORGANIC MEMBRANE

A porous substrate prepared in Example 3 was cemented onto the end of the smallest tube of the EVD reactor described in the EXPERIMENTAL section, to separate the reactor into a metal chloride-chamber and an oxidizing agent-chamber, with the substrate oriented such that the porous surface layer was connected with the metal chloride chamber.

The top layer of the lanthanum-doped alumina substrate had an average pore diameter of approximately 10 nm and a layer thickness of 3 $\mu$m. EVD experiments were performed at a total pressure of 2 mbar in both the chloride-and oxidizing agent-chambers. A mixture of water vapor (doubly distilled) and air (technical grade, Hoekloos) was used as the oxidizing agent as a 1:1 volume ratio, by passing the air through a water sparger held at 40° C.

The $ZrCl_4$ (99.9% 200 mesh, CERAC) and $YCl_3$ (99.9% 60 mesh, CERAC) sublimation beds were maintained at 155° C. and 613° C. respectively, and the chloride vapors were transported to the lanthanum-doped alumina substrate using an argon carrier gas (99.999% UHP 5.0), UCAR) which was passed through the sublimation beds, with a total argon carrier gas stream of 27.5 sccm. EVD was performed at a substrate temperature of 1000° C. and achieved pore closure in a period of 10 minutes, with a total deposition time of 30 minutes to produce a film approximately 0.2 $\mu$m thick.

Following deposition of the YSZ layer, the ultrathin YSZ film was impervious to inert gases such as Ar, He and $N_2$ as demonstrated by the zero flux of these gases through the membrane for a total pressure drop of 4 bar across the membrane. Subsequently, the oxygen permeability of the ultrathin YSZ membrane was determined at 1000° C. at a total pressure of 150 mbar on both sides of the membrane, with air and high purity argon (oxygen partial pressure of approximately $10^{-5}$ atm) initially on either side of the membrane. The results are provided in the Table.

TABLE
OXYGEN PERMEATION FLUXES WITH AIR AS PERMEATING GAS THROUGH YSZ FILMS GROWN ON ALUMINA SUBSTRATE (1000° C.)

| Run | Deposition Time (min) | Estimated YSZ thickness ($\mu$m) | Permeation Flux ($10^{-9}$ mol/cm$^2$s) |
|---|---|---|---|
| 1 | 10 | 0.5 | 55.3 |
| 2 | 30 | 0.5 | 55.3 |
| 3 | 30 | 0.5 | 31.5 |
| 4 | 30 | 0.5 | 17.1 |

EXAMPLE 5
PREPARATION OF AN ULTRATHIN INORGANIC MEMBRANE

An inorganic membrane comprising yttria-stabilized zirconia deposited onto a lanthanum-doped surface layer of an alumina substrate having an average pore diameter of 20 nm was prepared according to the procedure of Example 4 with the exception that the $ZrCl_4$ sublimation bed was maintained at 140° C., and the deposition was conducted at a temperature of 800° C. for five minutes. At the end of the deposition, a yttria-stabilized zirconia layer having a thickness of about 0.3 $\mu$m was deposited onto the substrate. Helium permeability experiments conducted on the substrate before and after depositing the multicomponent oxide demonstrated that helium permeability through the membrane was reduced by 90% indicating pore narrowing due to the multicomponent oxide which was deposited in the pores of the surface layer of the substrate. At a temperature of about 800° C., the deposition of multicomponent oxide will continue until the pores are plugged at which time additional material may form slowly by an EVD mechanism, but at a much slower rate than in the case of Example 4.

The ultrathin inorganic membranes according to the present invention are suitable for use in a wide variety of applications including processes for separating oxygen from an oxygen-containing gaseous mixture such as air. The apparatus and procedures for utilizing these inorganic membranes are well known in the art. One of ordinary skill in the art can readily adapt the available apparatus to separate oxygen from air using the claimed inorganic membranes.

The method for separating oxygen from an oxygen-containing gaseous mixture comprises compressing the gaseous mixture to a pressure ranging from 1 to 250 psig, heating the pressurized oxygen-containing gaseous mixture to a temperature ranging from about 450° to about 1100° C., feeding the compressed, heated gaseous mixture to the inorganic membrane which is selective to the permeation of oxygen over the other components of the gaseous mixture and separating the oxygen by selective permeation of oxygen through the membrane.

Moreover, the inorganic membranes of this invention are particularly suited toward use in solid oxide fuel cell (SOFC) reactors. The ultrathin multicomponent oxide layers having a thickness of less than or equal to 0.5 $\mu$m can be deposited as a thin gas-tight film onto a desired porous substrate to provide improved fuel cell performance. The construction of SOFCs suitable for practicing the present invention are well known in the art.

Having thus described the present invention, what is now deemed appropriate for Letters Patent is set forth in the following claims.

We claim:

1. A method for manufacturing an ultrathin inorganic membrane comprising a multicomponent oxide in a thickness less than or equal to about 0.5 $\mu$m which is deposited on a porous substrate having a porous surface layer, the method comprising:
   (a) independently heating at least two metal halides to temperatures sufficient to vaporize each of the metal halides;
   (b) introducing the vaporized metal halides into a first chamber of a reactor comprising two chambers which are connected by a removable porous substrate having a network of pores capable of transporting gases between the two chambers, said removable porous substrate further comprising a porous surface layer having an average pore diameter of less than or equal to about 50 nm;
   (c) introducing an oxidizing agent into a second chamber of the reactor;
   (d) contacting the metal halides and the oxidizing agent in the pores of the porous surface layer at a temperature, a pressure and for a time sufficient to deposit plugs of the multicomponent oxide within the pores of the surface layer of the substrate and to restrict growth of the plugs to a thickness of less than or equal to 0.5 $\mu$m to form the inorganic membrane.

2. The method according to claim 1 wherein the contacting occurs at a temperature ranging from 600° to 1300° C., a pressure ranging from 1 to 760 torr and a time ranging from 1 minute to 10 hours.

3. The method according to claim 2 wherein the porous substrate is selected from the group consisting of alumina, silica, magnesia, titania, a high temperature oxygen compatible metal alloy, a metal oxide stabilized zirconia and compounds and mixtures thereof.

4. The method according to claim 3 wherein the metal halides to be vaporized are represented by fluorides, chlorides, bromides and iodides of metals selected from Groups 2, 3, 4 and 15 and the F block lanthanides of the Periodic Table of the Elements.

5. The method according to claim 4 wherein the porous substrate connecting the first chamber and the second chamber is oriented such that the porous surface layer is contacted with the vaporized metal halides.

6. The method according to claim 5 wherein the metal halides to be vaporized further comprise a halide of zirconium.

7. The method according to claim 6 wherein the oxidizing agent is selected from the group consisting of oxygen, ozone, $N_2O$, water and mixtures thereof.

8. The method according to claim 6 wherein the oxidizing agent is selected from the group consisting of a mixture of oxygen and water and a mixture of hydrogen and water.

9. A method for manufacturing an ultrathin inorganic membrane comprising a yttria-stabilized zirconia layer having a thickness less than or equal to about 0.5 $\mu$m which is deposited onto a porous metal-doped alumina surface layer of a porous alumina substrate, the method comprising:
   (a) independently heating halides of yttrium and zirconium to temperatures sufficient to vaporize each of the metal halides;
   (b) introducing the vaporized metal halides into a first chamber of a reactor comprising two chambers which are connected by a removable porous alumina substrate having a network of pores capable of transporting gases between the chambers, said removable porous alumina substrate further comprising a porous metal-doped alumina surface layer having an average pore diameter of less than or equal to about 50 nm;
   (c) introducing an oxidizing agent into a second chamber of the reactor;
   (d) contacting the metal halides and the oxidizing agent in the pores of the metal-doped alumina layer at a temperature, a pressure and for a time sufficient to deposit plugs of the yttria stabilized zirconia within the pores of the metal-doped alumina surface layer and to restrict growth of the plugs to a thickness of less than or equal to 0.5 $\mu$m to form the inorganic membrane.

10. The method according to claim 9 wherein the contacting according to step (d) occurs at a temperature ranging from 700° to 1100° C., a pressure ranging from 1 to 760 torr and a time ranging from 1 minute to 2 hours.

11. The method according to claim 10 wherein the porous substrate connecting the first chamber and the second chamber is oriented such that the porous surface layer is contacted with the vaporized metal halides.

12. The method according to claim 11 wherein the metal halides to be vaporized are selected from the group consisting of chlorides, bromides and iodides of zirconium and yttrium.

13. The method according to claim 12 wherein the metal halides are introduced into the first chamber of the reactor by means of an inert carrier gas.

14. The method according to claim 13 wherein the inert carrier gas is selected from the group consisting of argon, nitrogen and helium.

15. The method according to claim 14 wherein the oxidizing agent is selected from the group consisting of oxygen, ozone, $N_2O$, water and mixtures thereof.

16. The method according to claim 15 wherein the oxidizing agent is a mixture selected from the group consisting of oxygen and water, and hydrogen and water.

17. The method according to claim 16 wherein the alumina surface of the porous alumina substrate is doped with a metal selected from F block lanthanides of the Periodic Table of the Elements.

18. An ultrathin inorganic membrane formed by the method according to claim 1 wherein the membrane comprises a multicomponent oxide layer having a thickness less than or equal to about 0.5 $\mu$m which is deposited onto a surface layer of a porous substrate having an average pore diameter of less than about 50 nm.

19. The inorganic membrane according to claim 18 wherein the porous substrate is selected from the group consisting of alumina, silica, magnesia, titania, a high temperature oxygen compatible metal alloy, and a metal oxide stabilized zirconia, and compounds and mixtures thereof.

20. The inorganic membrane according to claim 19 wherein the multicomponent oxide comprises two or more metals selected from Groups 2, 3, 4 and 15 and the F block lanthanides of the Periodic Table of the Elements.

21. The inorganic membrane according to claim 20 wherein the multicomponent oxide further comprises zirconia.

22. The inorganic membrane according to claim 19 wherein the porous surface layer of the porous substrate comprises a composition differing from the composition of the porous substrate.

23. An inorganic membrane formed by the process according to claim 9 which comprises a yttria-stabilized zirconia layer having a thickness less than or equal to about 0.5 $\mu$m which has been deposited onto a metal-doped porous alumina surface layer of an alumina substrate having an average pore diameter of less about 50 nm.

24. The inorganic membrane according to claim 23 wherein the metal-doped porous alumina surface layer comprises lanthanum-doped alumina.

* * * * *